(12) United States Patent
Yamaguchi et al.

(10) Patent No.: US 9,123,504 B2
(45) Date of Patent: Sep. 1, 2015

(54) SEMICONDUCTOR INSPECTION DEVICE AND SEMICONDUCTOR INSPECTION METHOD USING THE SAME

(75) Inventors: Atsuko Yamaguchi, Kodaira (JP); Yoshinori Momonoi, Tachikawa (JP); Junichi Tanaka, Hachioji (JP); Hiroki Kawada, Tsuchiura (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 695 days.

(21) Appl. No.: 13/380,526

(22) PCT Filed: Jun. 23, 2010

(86) PCT No.: PCT/JP2010/004183
§ 371 (c)(1),
(2), (4) Date: Dec. 23, 2011

(87) PCT Pub. No.: WO2011/001635
PCT Pub. Date: Jan. 6, 2011

(65) Prior Publication Data
US 2012/0098954 A1 Apr. 26, 2012

(30) Foreign Application Priority Data
Jun. 30, 2009 (JP) .................................. 2009-155227

(51) Int. Cl.
*H04N 9/47* (2006.01)
*H04N 7/18* (2006.01)
(Continued)

(52) U.S. Cl.
CPC ............... *H01J 37/28* (2013.01); *H01J 37/244* (2013.01); *H01L 22/12* (2013.01);
(Continued)

(58) Field of Classification Search
None
See application file for complete search history.

(56) References Cited

U.S. PATENT DOCUMENTS

| 5,986,263 A | 11/1999 | Hiroi et al. |
| 6,172,363 B1 | 1/2001 | Shinada et al. |

(Continued)

FOREIGN PATENT DOCUMENTS

| JP | 59-099732 | 6/1984 |
| JP | 09-320505 | 12/1997 |

(Continued)

OTHER PUBLICATIONS

Chu et al., "Characterization of Across-Device Linewidth Variation (ADLV) for 65 nm Logic SRAM Using CDSEM and Linewidth Roughness Algorithms," 2006, Proc. of SPIE vol. 6152 61520Y-1.

*Primary Examiner* — Anner Holder
*Assistant Examiner* — Ellyar Y Barazesh
(74) *Attorney, Agent, or Firm* — Baker Botts L.L.P.

(57) ABSTRACT

Provided are a semiconductor inspection device and a semiconductor inspection method such that in a specimen image in a single field of view obtained by an electron microscope, it is possible to suppress variations in the edge position measurement error attributable to the materials and structures of the lower layers of measured patterns by a first method, wherein the area in the field of view obtained by electron beam scanning is divided into a plurality of regions on the basis of information regarding the structures and materials of the object to be observed and the electron beam scanning conditions are changed for individual regions (805, 806), a second method, wherein the image processing conditions are changed for individual regions resulting from division of the obtained images, or a third method, wherein the edge detection conditions are changed for individual regions resulting from the division within the edge inspection regions of the obtained images.

3 Claims, 13 Drawing Sheets

(51) Int. Cl.
  H01J 37/28 (2006.01)
  H01J 37/244 (2006.01)
  H01L 21/66 (2006.01)
  *G06T 7/00* (2006.01)
  *G02B 21/36* (2006.01)
  *G02B 21/00* (2006.01)
  *G06T 5/50* (2006.01)

(52) U.S. Cl.
  CPC .......... *G01B 2210/56* (2013.01); *G02B 21/002* (2013.01); *G02B 21/361* (2013.01); *G02B 21/365* (2013.01); *G02B 21/367* (2013.01); *G06T 5/50* (2013.01); *G06T 7/0004* (2013.01); *G06T 7/0006* (2013.01); *G06T 7/0008* (2013.01); *G06T 7/0026* (2013.01); *G06T 2207/10016* (2013.01); *G06T 2207/10056* (2013.01); *G06T 2207/10061* (2013.01); *G06T 2207/20081* (2013.01); *G06T 2207/30141* (2013.01); *G06T 2207/30148* (2013.01); *H01J 2237/24578* (2013.01); *H01J 2237/24592* (2013.01); *H01J 2237/2816* (2013.01); *H01J 2237/2817* (2013.01); *H01L 2924/0002* (2013.01)

(56) References Cited

U.S. PATENT DOCUMENTS 6,405,153 B1 * 6/2002 Fiekowsky .................. 702/172
7,235,782 B2   6/2007 Takane et al.
2002/0038510 A1 * 4/2002 Savareigo et al. .............. 29/846
2002/0080261 A1 * 6/2002 Kitamura et al. ............. 348/349
2002/0158199 A1  10/2002 Takane et al.
2005/0036783 A1 * 2/2005 Morita et al. ................. 396/611
2006/0215901 A1 * 9/2006 Nakagaki et al. ............. 382/149
2007/0187595 A1   8/2007 Tanaka et al.
2007/0206096 A1 * 9/2007 Cooke et al. ............. 348/207.99
2007/0221842 A1   9/2007 Morokuma et al.
2008/0067371 A1 * 3/2008 Kurihara et al. ............. 250/307
2009/0272899 A1  11/2009 Yamazaki et al.

FOREIGN PATENT DOCUMENTS

| JP | 10-294345 | 11/1998 |
| JP | 11-316115 | 11/1999 |
| JP | 2001-093950 | 4/2001 |
| JP | 2002-328015 | 11/2002 |
| JP | 2004-157135 | 6/2004 |
| JP | 2005-277395 | 10/2005 |
| JP | 2007-218711 | 8/2007 |
| JP | 2007-248087 | 9/2007 |
| JP | 2008-153085 | 7/2008 |
| JP | 2009-016356 | 1/2009 |
| JP | 2011-103177 | 5/2011 |

* cited by examiner

SEMICONDUCTOR INSPECTION DEVICE AND SEMICONDUCTOR INSPECTION METHOD USING THE SAME

TECHNICAL FIELD

The present invention relates to a system and a method for measuring the size of a pattern on a specimen by using an electron microscope, and more particularly, to a semiconductor inspection device and a semiconductor inspection method using the same that evaluate the shape of a pattern formed on a wafer in a manufacturing process of a semiconductor device.

BACKGROUND ART

In the manufacturing process of the semiconductor device, the number of layers of fine patterns formed on a substrate, whether the patterns are processed on a wafer as designed, or whether the sizes of the processed patterns vary is inspected. In the inspection, a scanning type electron microscope which is excellent for measuring fine sizes has been used in the related art. Devices or methods performing various inspections using the electron microscope are disclosed, for example, in Patent Literatures 1 to 7 or Non-Patent Literature 1.

CITATION LIST

Patent Literature

Patent Literature 1: JP-A No. 11-316115
Patent Literature 2: JP-A No. 2007-218711
Patent Literature 3: JP-A No. 2008-153085
Patent Literature 4: JP-A No. 9-320505
Patent Literature 5: JP-A No. 2004-157135
Patent Literature 6: JP-A No. 2005-277395
Patent Literature 7: JP-A No. 2007-248087

Non-Patent Literature

Non-Patent Literature 1: Proc. of SPIE Vol. 6152 61520 Y-1 (2006)

SUMMARY OF INVENTION

Technical Problem

When an inspection in a semiconductor manufacturing process in the related art was performed, only an area of a gate line placed on a semiconductor material was measured by using the method, for example, at the time of measuring a line width of a gate line pattern controlling the performance of a semiconductor device (this shape is shown in FIG. 1). The reason is that the performance of a completed transistor could be anticipated with satisfactory accuracy based on only a value of a part where the gate pattern is placed on an active area 102 where the semiconductor material is exposed in the width of a gate pattern 101.

However, in recent years, due to a reason to be described below, the width of a gate line placed on an insulating layer area 103 of FIG. 1, which is formed to isolating the transistors from each other and even a line width on a step area 104 which is an interface between the area 101 and the insulating layer area 103 have started needing to be measured. In order to display information which needs to be measured in detail, an example in which the width of the line pattern of FIG. 1 is measured along a line is shown in FIG. 2. The y of a graph corresponds to a y-coordinate shown in FIG. 1.

In the related art, although a mean size value in an active area 201 of FIG. 2 corresponding to the line width on the active area 102 of FIG. 1 is obtained, in recent years, variations in a size value in an area 202 other than both ends of the line needs to be obtained accurately. Herein, variations in an edge direction of a local line width on the graph, i.e., a predetermined range will be referred to as a linewidth profile. Further, even in the case of patterns other than the line pattern, only a part of the pattern was measured to be treated as a size representing value of the pattern as yet, but in recent years, not the representing value but the entire pattern needs to be verified accurately. That is, whether the pattern is transferred accurately enough to implement required device performance cannot be evaluated by using the pattern or only one index extracted from a part of the pattern in the related art.

A first reason for requiring the measurement is that the necessity of mask pattern modification can be accurately judged by the data thereof. For example, Non-Patent Literature 1 discloses a case using the linewidth profile. The literature discloses an example in which based on the fact that a line width intends to increase in an area where variation does not almost occur with respect to Y originally, it is judged that optical proximity correction of a mask is insufficient.

A second reason is that information thereof is an important amount associated with the performance of a device. Accordingly, when judging a passing status of a prepared pattern, the linewidth profile or pattern shape data is helpful.

A third reason is that a condition of a processing operation to be executed next with respect to a wafer to be observed can be optimized by using the information. By executing the inspection and the control, a yield rate of a semiconductor device can be improved. On the contrary, as long as productivity is not improved by using the method, an up-to-date semiconductor device cannot be produced.

Further, even in the line pattern, when a 2D shape of a pattern (a 2D shape of a pattern edge) can be accurately measured, the linewidth profile can be accurately measured, thus, thereafter, a method of accurately measuring the position of the pattern edge by using an electron microscope will be thought.

The inventors' examination results of factors that interfere with accurate measurement of the position of the pattern edge will be described below.

The first factor is a cross section-direction pattern structure (step, slope, top-rounding, and bottom-tailing). This shape is shown in FIG. 3. Reference numeral 301 is a mimetic diagram of an image of a line pattern observed by using a scanning type electron microscope. The center is the line pattern. A cross-sectional shape acquired by cutting the line pattern image in a plane vertical to a ground surface represented by a line 302 is represented by reference numeral 304 and a signal profile of the corresponding part on the scanning type electron microscope is represented by reference numeral 306. Likewise, a cross-sectional shape and a signal profile on a line 303 are represented by reference numerals 305 and 307, respectively. For example, even though the line width of the center in the pattern has a predetermined value (set to a), if the cross-sectional shape varies, the signal profile is different, and as a result, the position of the pattern edge varies.

The second factor is a constituent material. For example, even though the cross-sectional shape is constant, if the pattern or a constituent material of a background of the pattern is different, the shape of an acquired signal profile varies depending on a place. This example is shown in FIG. 4. FIG. 4 shows an image acquired by observing an area with the same cross-sectional shape where patterns of different materials are arranged by using the scanning type electron microscope. A line pattern 401 is made of an insulator and a line pattern 402 is made of a semiconductor. The background is the semiconductor. A signal profile on the line expressed by a line 403 of the patterns thereof is represented by reference numeral 404. A peak of a signal corresponding to the line pattern 401 made of the insulator is widened and a peak of a signal corresponding to the line pattern 402 made of the semiconductor is narrowed.

The third factor is easiness of circumferential charging-up. If the circumference is the insulator, the signal profile is strongly influenced by charging-up and as in the second factor, the peak of the signal tends to be widened. The influence on the signal profile causes the position of the edge to be displaced from the original position.

Further, the aforementioned patterns exist actually. For example, a gate electrode width of a transistor is an important measurement target, but an active area constituting a channel of the transistor and a device isolation area isolating the respective transistors coexist in this lower layer. Generally, in the active area, a gate insulating layer having a thickness of several nm or less is formed on the surface of a Si substrate having high conductivity and a relatively thick insulating layer is used as the device isolation area. Further, in the active area, an active area of an n-channel transistor and an active area of a p-channel transistor may coexist. In the n-channel area and the p-channel area, the type and the concentration of a dopant of the Si substrate in the lower layer of the gate insulating layer are different. Further, in the active area and the device isolation area, a step of approximately a maximum of tens of nm may be generated.

Further, in Patent Literature 1, a method of automatically performing size measurement by using the scanning type electron microscope is disclosed. In Patent Literature 1, a signal acquired by using the scanning type electron microscope is averaged in a size measurement direction and a vertical direction and thereafter, the size is calculated. Patent Literature 1 discloses a means that can display an area where the size measurement is performed by the averaging which is overlapped with a specimen image acquired by using the scanning type electronic microscope, adjust this area to a predetermined position on the specimen image, and measure the size of a predetermined area on the specimen image easily.

Patent Literature 2 discloses a method of estimating and creating as a library a measurement signal waveform when the cross-sectional shape and the size of a measurement target vary by using an electron-beam simulation considering a characteristic of the scanning type electron microscope by considering that the relationship between the signal acquired by the scanning type electron microscope and the original edge position is changed according to the cross-sectional shape of the measurement target. By comparing an actually measured signal waveform with various signal waveforms recorded in the library, signal waveforms having the highest degree of coincidence are selected to implement a reduction in a measurement error.

Further, Patent Literature 3 discloses a technology of measuring an electric potential on a surface of a specimen using a charged particle beam while restraining a change in the electric potential on the specimen induced by the charged particle beam irradiation or detecting a compensation value for a change in a condition for the apparatus caused by the specimen being electrically changed in the case of measuring materials which are easily charged, such as a resist, an insulating film, or a Low-k material. Further, Patent Literature 4 discloses a technology of reducing charge-up and acquiring an accurate specimen image by optimizing acceleration voltage of electron-beams or an electric potential gradient around a measurement target or a technology of performing accurate measurement by corresponding a parameter used to extract a measurement value from a detection signal of a device to a charge-up phenomenon. In addition, Patent Literature 5 discloses a technology of acquiring the accurate specimen image by appropriately selecting electron-beam irradiation conditions (irradiated energy, beam current, and the number of irradiation times) according to a material or a shape of a pattern to be measured.

As described above, Patent Literatures 2, 3, 4, and 5 disclose a method of suppressing a measurement error of the edge position caused by the material or shape of the measurement pattern and the material of the lower layer. However, the above Patent Literatures including Patent Literature 1 do not at all disclose a technology of suppressing the error of the edge measurement position or variation in the error itself and measuring the shape of the fine pattern included in one viewing field with high precision when a material structure of the lower layer of the measurement pattern are multiple types in one viewing field observed by using the electron microscope.

Patent Literature 6 or 7 discloses a phenomenon in which measurement images are different from each other when a pattern of a pre-process exits in the lower layer of the measurement pattern and when the pattern of the pre-process does not exist. However, Patent Literature 6 or 7 discloses a method of changing a tolerance by considering variations in the measurement error from the reason only in the case where the pattern of the pre-process exists in the lower layer of the measurement pattern at the time of inspecting whether the difference between a measurement value and a design value of a predetermined pattern size can be allowed by comparing an observed image and design data (that is, whether the observed wafer is passed or not). As a result, the variations in the edge position measurement error cannot be suppressed within the specimen image in one viewing field.

An object of the present invention is to provide a semiconductor inspection device and an inspection method of the semiconductor inspection device that can suppress the variations in the edge position measurement error caused by the material structure of the lower layer of the measurement pattern, within the specimen image in one viewing field acquired by using the electron microscope.

Solution to Problem

An embodiment for achieving the object provides a semiconductor inspection device evaluating a 2D profile by detecting an edge of a pattern from an image acquired by observing the pattern on a substrate by scanning an electron-beam, the device including: a storage device previously storing design data of the pattern or data of a pattern profile estimated through the whole patterning process, and data of the pattern and a material or a structure configuring a background of the pattern; and an arithmetic device having a comparison function of comparing the design data of the pattern or the data of the pattern profile estimated through the whole patterning process which is stored in advance with the data of the image acquired through observation, a dividing function of dividing an observation area into plural areas for each expected area when reaction to the electron-beam incident in the observation area is different by using a result of operating the comparison function and the data of the material or structure configuring the background of the pattern which is stored in advance, and a function of calculating a linewidth profile by detecting the edge of the pattern from an image acquired by scanning the electron-beam to the plural areas divided by the dividing function under different scanning conditions.

Further, a semiconductor inspection method using the semiconductor inspection device includes: a process of acquiring a first image of a pattern; a process of extracting a contour of the acquired first image pattern; a process of extracting patterns that correspond to each other by comparing the extracted pattern of the contour and design data of the pattern or data of a pattern profile estimated through the whole patterning process; a process of dividing an area including the patterns that correspond to each other into plural areas by using the pattern and data of a material or a structure configuring a background of the pattern; a process of determining a scanning condition of a scanned electron-beam for each of the plural areas in the area including the patterns that correspond to each other; a process of acquiring a second image by scanning the electron-beam in accordance with the scanning condition determined for each of the plural areas; and a process of detecting a desired edge from the second image and calculating a linewidth profile.

Further, a semiconductor inspection device evaluating a 2D profile by detecting an edge of a pattern from an image acquired by observing the pattern on a substrate by scanning an electron-beam includes: a storage device previously storing design data of the pattern or data of a pattern profile estimated through the whole patterning process, and data of the pattern and a material or a structure configuring a background of the pattern; and an arithmetic device having a comparison function of comparing the design data of the pattern or the data of the pattern profile estimated through the whole patterning process which is stored in advance with the data of the image acquired through observation, a dividing function of dividing the image into plural areas for each expected area when reaction to the electron-beam incident in the observation area is different by using a result of operating the comparison function and the data of the material or structure configuring the background of the pattern which is stored in advance, and a function of calculating a linewidth profile by detecting the edge of the pattern from an image acquired by image-processing the plural areas under different image processing conditions.

Further, a semiconductor inspection method using the semiconductor inspection device includes: a process of acquiring a first image of a pattern; a process of extracting a contour of the acquired first image pattern; a process of extracting patterns that correspond to each other by comparing the extracted pattern of the contour and design data of the pattern or data of a pattern profile estimated through the whole patterning process; a process of dividing an area including the patterns that correspond to each other into plural areas by using the pattern and data of a material or a structure configuring a background of the pattern; a process of determining an image processing condition in the area including the patterns that correspond to each other for each of the plural areas; a process of acquiring a second image by performing image processing in accordance with the image processing condition determined for each of the plural areas; and a process of detecting a desired edge from the second image and calculating a linewidth profile.

Further, a semiconductor inspection device evaluating a 2D profile by detecting an edge of a pattern from an image acquired by observing the pattern on a substrate by scanning an electron-beam includes: a storage device previously storing design data of the pattern or data of a pattern profile estimated through the whole patterning process, and data of the pattern and a material or a structure configuring a background of the pattern; and an arithmetic device having a comparison function of comparing the design data of the pattern or the data of the pattern profile estimated through the whole patterning process which is stored in advance with the data of the image acquired through observation, a dividing function of dividing the image data into plural areas for each expected area when reaction to the electron-beam incident in the observation area is different by using a result of operating the comparison and the data of the material or structure configuring the background of the pattern which is stored in advance, in an inspection area of an edge, and a function of calculating a linewidth profile by detecting the edge of the pattern under different edge detection conditions for each of the plural areas.

Further, a semiconductor inspection method using the semiconductor inspection device includes: a process of acquiring an image of a pattern; a process of extracting a contour of the acquired image pattern; a process of extracting patterns that correspond to each other by comparing the extracted pattern of the contour and design data of the pattern or data of a pattern profile estimated through the whole patterning process; a process of inputting an inspection area of an edge; a process of dividing an area including the patterns that correspond to each other into plural areas by using the pattern and data of a material or a structure configuring a background of the pattern in the inspection area; a process of determining an edge detection condition in the inspection area for each of the plural areas; and a process of detecting the edge in accordance with the edge detection condition determined for each of the plural areas and calculating a linewidth profile.

Advantageous Effects of Invention

The present invention can provides a semiconductor inspection device and an inspection method of the semiconductor inspection device that can suppress the variations in the edge position measurement error caused by the material structure of the lower layer of the measurement pattern, within the specimen image in one viewing field acquired by using the electron microscope.

DESCRIPTION OF EMBODIMENTS

Figure 1:
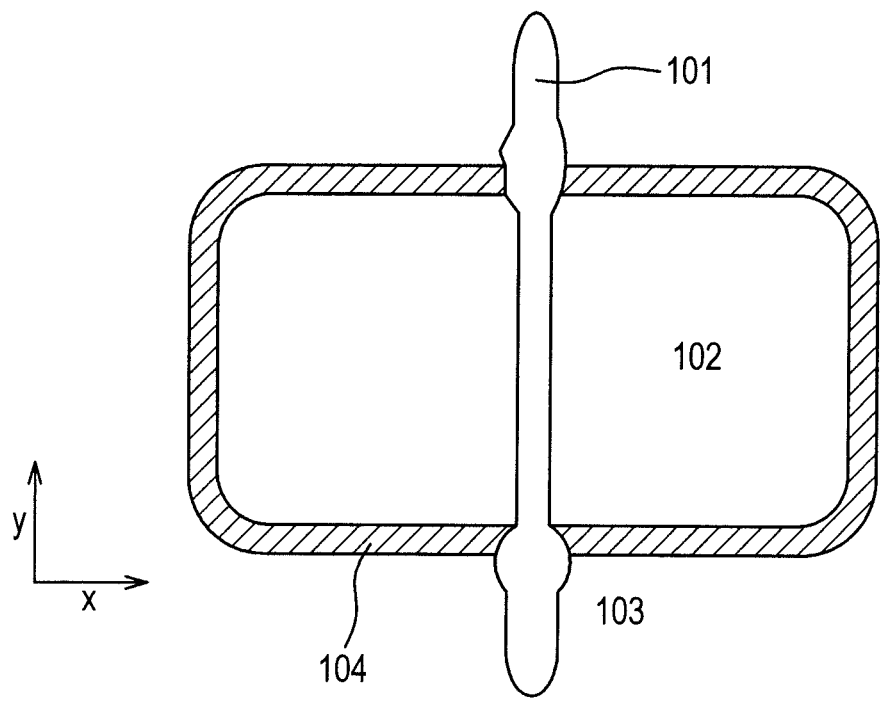
FIG. 1 is a plan view showing an example of a semiconductor pattern transferred onto a substrate.
Figure 2:
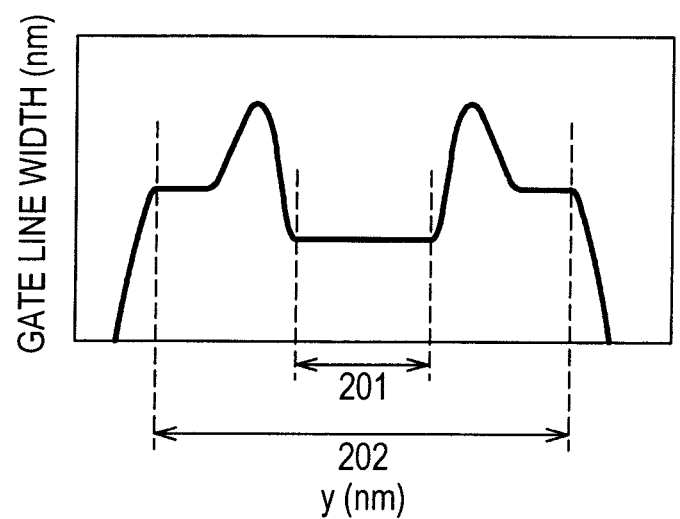
FIG. 2 is a graph showing variation in line width when the width of a line pattern of FIG. 1 is measured along the line.
Figure 3:
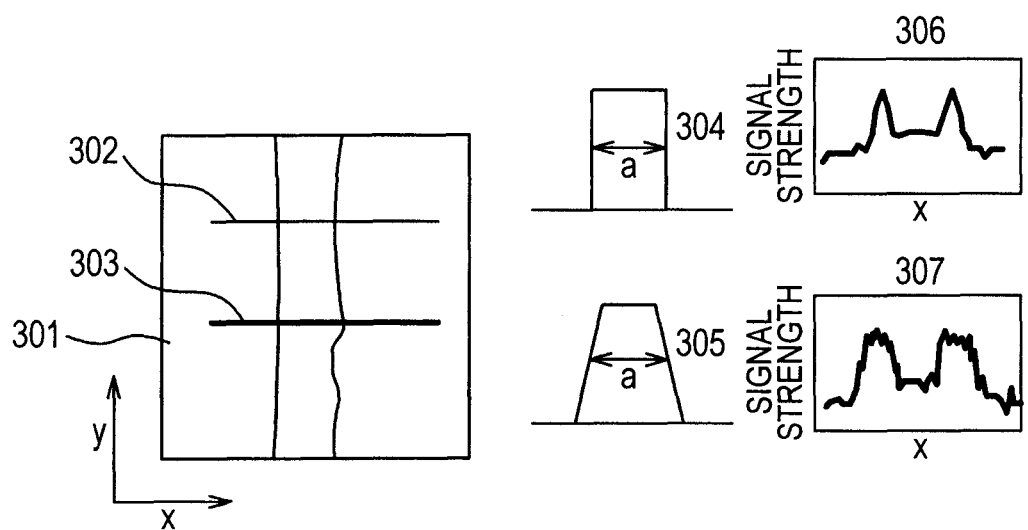
FIG. 3 is a mimetic diagram showing an upper observed image of the pattern on the substrate by using an electron microscope, a cross-sectional profile of the pattern and a signal of the electron microscope.
Figure 4:
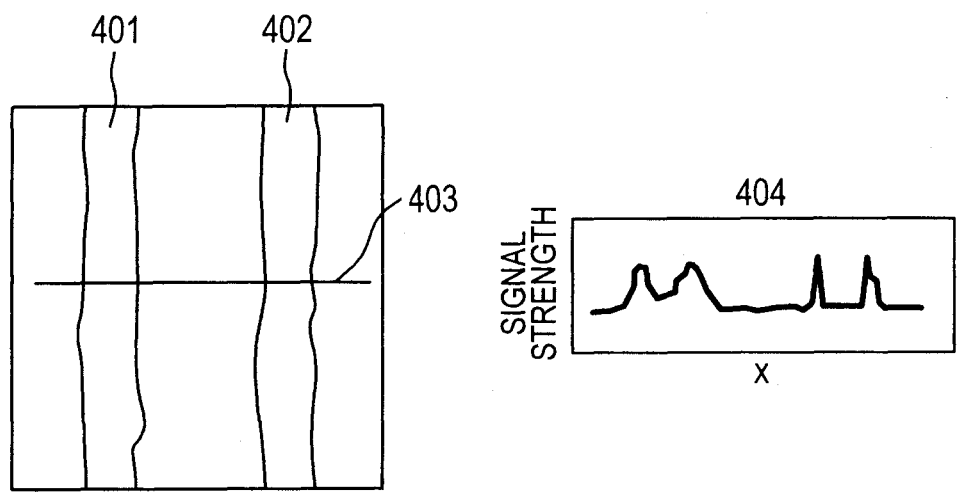
FIG. 4 is a mimetic diagram showing the upper observed image of the pattern on the substrate by using the electron microscope and a signal profile.

As embodiments for implementing the present invention, three methods described below, which are largely divided, are used. A first method is a new method in a step of acquiring an image by using an electron microscope. In this method, an observation condition is changed within a viewing field based on information regarding the structure or material of an observation target within the viewing field. Up to now, a method of optimizing the observation condition has been provided to observe one viewing field, but a method of dividing the viewing field into plural areas based on the material or structure and implementing optimal observation in each area was not provided.

A second method is a method of obtaining an image under one kind of condition as in the related art, dividing the obtained image into the plural areas based on the included material or structure, and acquiring an image equivalent to the image acquired by executing the first method through optimal image processing in each area.

A third method is a method of obtaining the image under one kind of condition as in the related art, dividing the obtained image into the plural areas based on the included material or structure, and acquiring an edge by using an optimal edge extraction (detection) condition for each area at the time of extracting an edge of a pattern from the image.

When there is provided a system of changing acceleration voltage, a current value, and a focus of an irradiated electron beam of the electron microscope simply and rapidly, the first method is the most preferably selected. However, when there is no such hardware, the case can be addressed by selecting the second method. Since the second method does not require complicated hardware, the second method is inexpensive. The third method does not require hardware like the second method. Further, since data is processed more simply than the second method, the third method is advantageous in that a time required for processing is short. However, meanwhile, since possible processing is limited, a correspondable specimen structure is limited.

Even in any method, in the embodiment, a measurement system including an electron microscope device, has a function to input design data or 2D image data of an estimated pattern or data of a contour of the pattern including height information or information on constitutional materials of each area, a function to maintain the record of the data, and a function to read the record in a control system of the system.

Simultaneously, the aforementioned functions may be combined with a function to input a recipe (hereinafter, referred to as a measurement recipe) of observation and measurement of a size measurement position or an obtaining condition of a specimen image, a function to maintain a record, and a function to read the record in a control system of the system in the related art.

Hereinafter, embodiments will be described.

First Embodiment

In the embodiment, a first method which gives an example is used as a mode for carrying out the present invention and an example of measuring a linewidth profile of a line pattern of silicon Si prepared on the structure of an insulator and a semiconductor, which has a step will be described with reference to FIGS. 5, 6, 7, 8, 9, 18, and 19.

Figure 5:
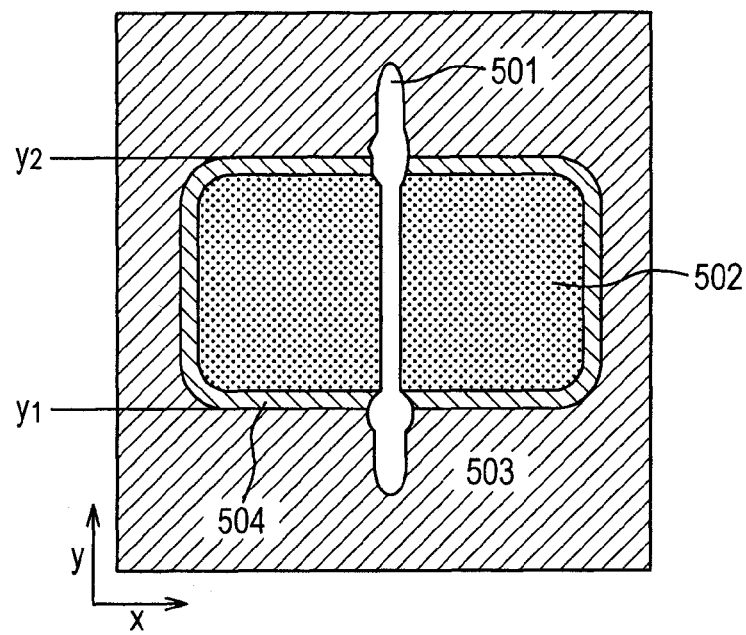
FIG. 5 shows a mimetic diagram of an electron microscope image of which the linewidth profile is calculated and x and y axes assumed with respect to an image in a first and second embodiments.
Figure 6:
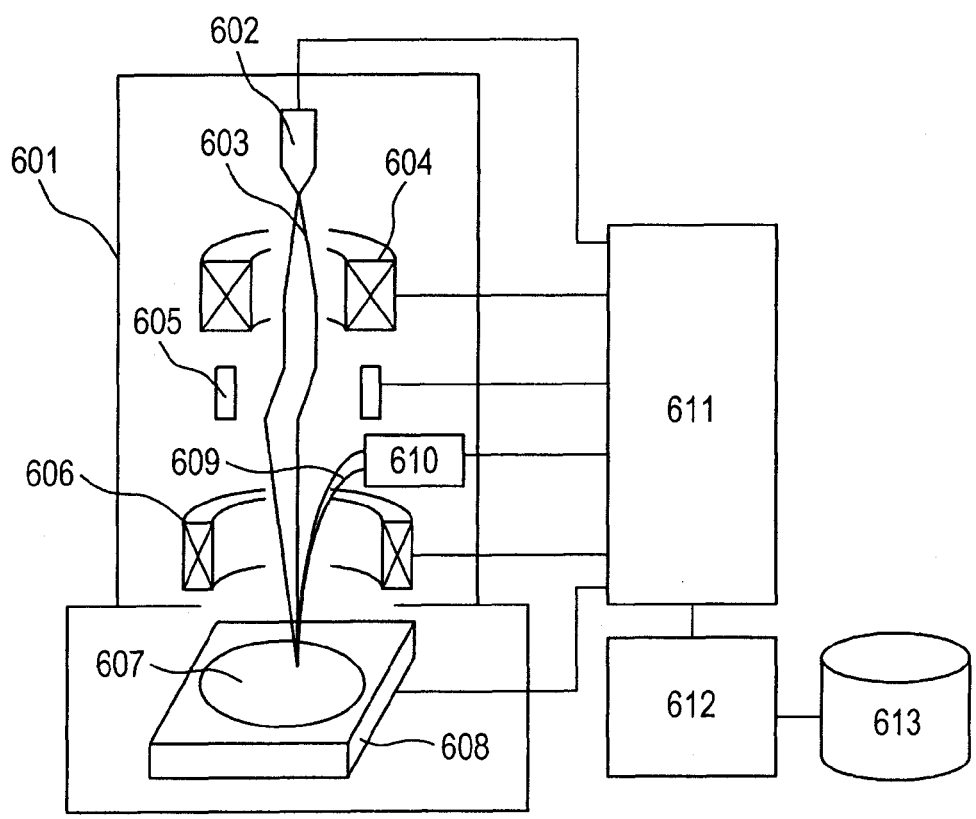
FIG. 6 is a conceptual diagram of a device used in the first and second embodiments and a third embodiment.
Figure 7:
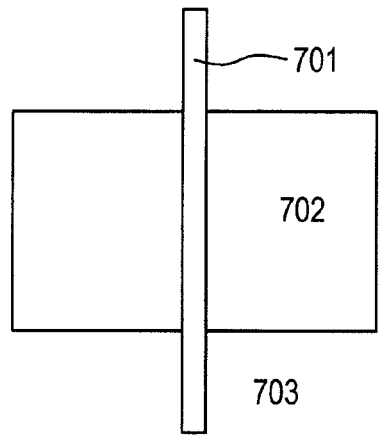
FIG. 7 is a plan view of a designed pattern used for analysis in the first embodiment.
Figure 8:
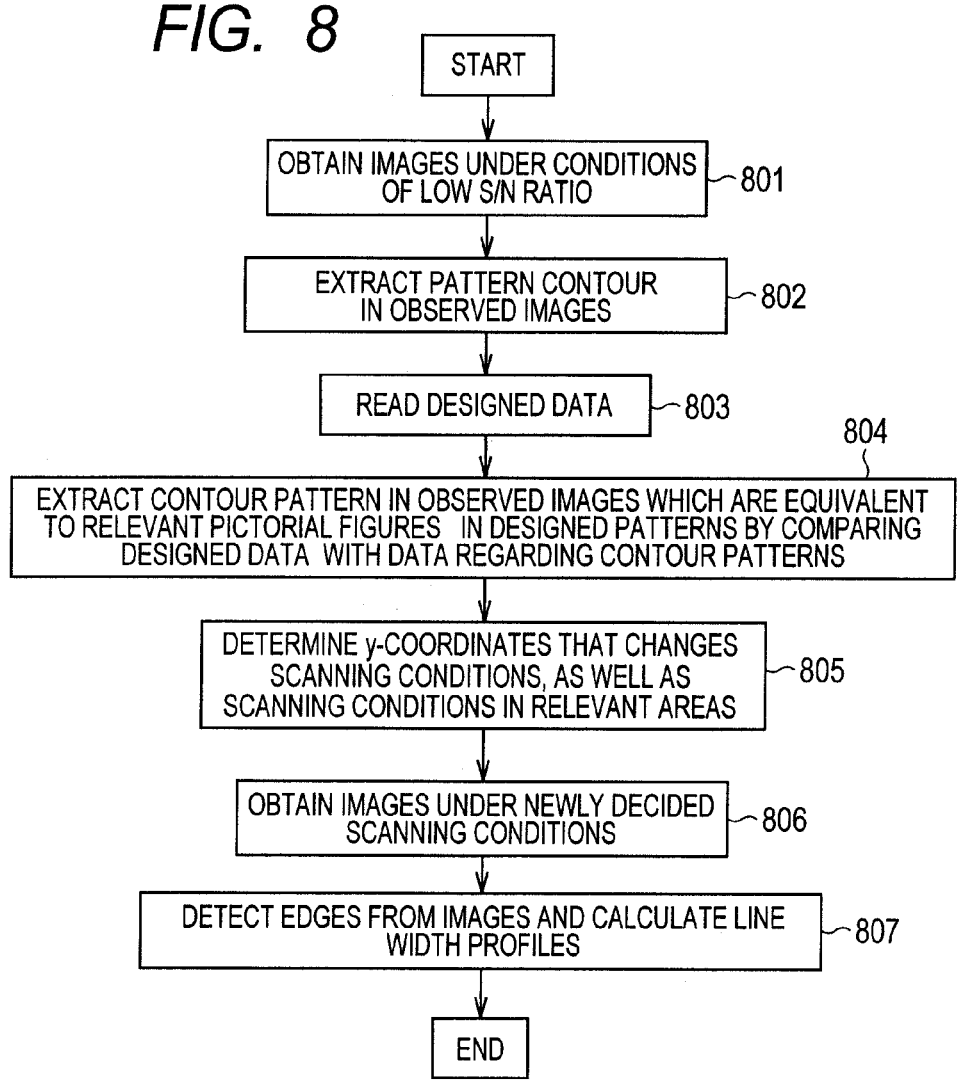
FIG. 8 is a flowchart recording a flow of the first embodiment.
Figure 9:
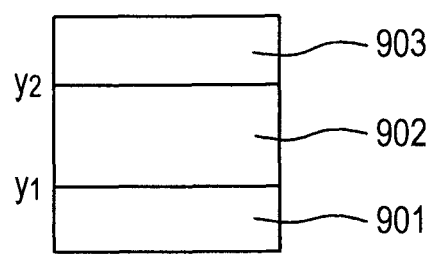
FIG. 9 is a diagram showing dividing of an observation area in the first embodiment.
Figure 18:
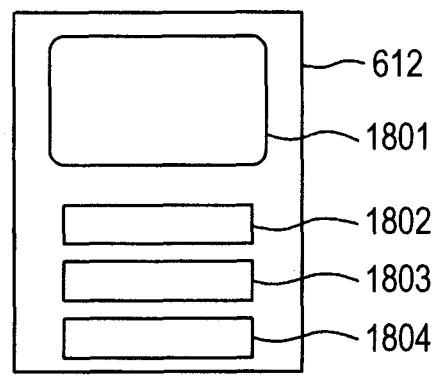
FIG. 18 is a conceptual diagram showing a configuration of a computer 612 used in the first embodiment.
Figure 19:
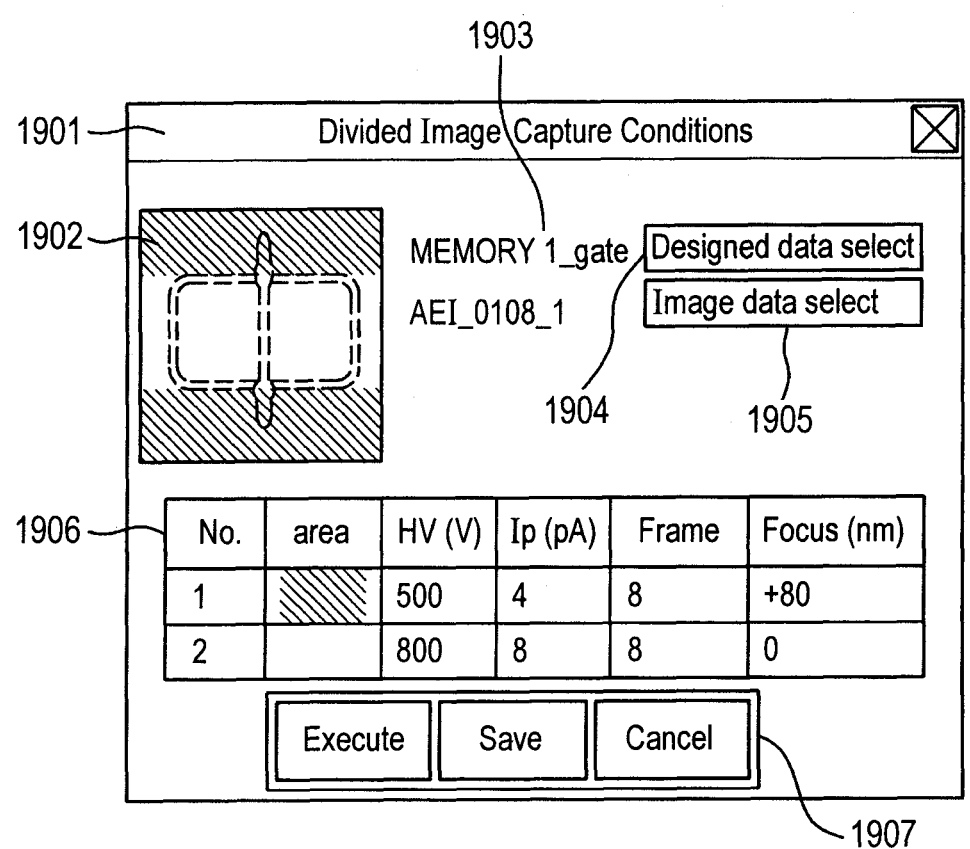
FIG. 19 is a screen displayed on a monitor of the first embodiment.

FIG. 5 is a mimetic diagram of an image of an electron microscope of which a linewidth profile is calculated in the embodiment. FIG. 6 is a conceptual diagram of a semiconductor inspection device used in the embodiment. FIG. 7 shows a designed pattern used for analysis in the embodiment. FIG. 8 is a flowchart recording a flow of the embodiment. FIG. 9 is a mimetic diagram showing an area where a scanning condition of the electron microscope is different. FIG. 18 shows a configuration of a system controlling computer 612 in FIG. 6. Further, FIG. 19 shows an example of a window 1901 displayed on a monitor 1801. Reference numeral 1902 represents a 2D image in which an SEM image and divided scanning areas are overlapped with each other, reference numeral 1903 represents a display unit of names of a design data file and an SEM image file, reference numeral 1904 represents a click button when design data intends to be changed, reference numeral 1905 represents a click button when the SEM image intends to be changed, and reference numeral 1906 represents a scanning condition display unit of each scanning area.

First, step 810 shown in FIG. 8 is executed. That is, an image of a pattern to acquire an accurate linewidth profile is obtained under an observation condition of a low S/N ratio. Specifically, the system controlling computer 612 is operated and a wafer 607 is installed in an observation stage and thereafter, the image is obtained simultaneously with observing a pattern on the wafer by operating an electron microscope controlling system 611 from the system controlling computer 612.

Both the length and the breadth of the viewing field in observation are 900 nm. Further, acceleration voltage of an electron-beam 603 of the electron microscope used to observe the viewing field is 500 V, a current value is 5 pA, and a signal cumulated number (the number of times of repeated electron-beam scanning to acquire image data) is 4 times.

The mimetic diagram of the acquired image is shown in FIG. 5. In FIG. 5, the acquired image and x and y axes for defining the position of spots in the image are shown. An apex in a lower-left portion of the image is an original point (x=y=0). Continuously, operations described below are performed. The operations are performed by operating the system controlling computer 612 through an input device 1802 shown in FIG. 18. Further, reference numeral 601 represents a casing of a scanning electron-beam microscope, reference numeral 602 represents an electron gun, reference numeral 604 represents a convergence lens, reference numeral 605 represents a beam deflector, reference numeral 606 represents an objective lens, reference numeral 608 represents a stage, reference numeral 609 represents a secondary electron, and reference numeral 610 is a detector.

Next, the process proceeds to step 802 and a contour of a pattern is extracted from the image acquired in step 801, in a computer arithmetic device 1803. Next, the process proceeds to step 803 and design data of a part of which a pattern intends to be accurately measured from the storage device 613 is transmitted to a temporary storage area 1804 connected to the computer arithmetic device 1803 (reading).

Further, although the design data is used in the embodiment, data of a pattern profile estimated through the whole patterning process in an actual semiconductor device manufacturing process may be used. As a result, the 2D shape of the design data is shown in FIG. 7. Further, a gate area 701 is made of polysilicon, an active area 702 is made of silicon, and an isolation area 703 is made of dioxide silicon ($SiO_2$). Information that the isolation area 703 is 80 nm higher than the active area 702 is read.

Next, the process proceeds to step 804. The image of FIG. 5 is compared with the pattern of FIG. 7 in the arithmetic device 1803 by using the input device 1802 of the computer 612. As a result, the arithmetic device 1803 recognizes that patterns corresponding to a gate area 501, an active area 502, and an isolating insulating film area 503 in a specimen which is being observed at present are the gate area 701, the active area 702, and the isolation area 703 and extracts contour patterns of the area 501, the area 502, and the area 503.

Next, the process proceeds to step 805 to acquire a y-coordinate, i.e., y1 of a position where a background is changed from the area 703 to the area 702, which is shown from a lower direction to an upper direction of FIG. 7 along the area 701. By proceeding to a far upper direction, a y-coordinate, i.e., y2 of a position where the background is changed from the area 702 to the area 703 again is acquired.

Further, based on the information thereof, the arithmetic device 1803 calls a group of scanning conditions corresponding to information on the material or height previously stored in the storage device 613 and stores the group in the temporary storage device 1804, and further, the optimal one among them is selected and the selected optimal one is displayed on a monitor 1801. This shape is shown in FIG. 19. Under the conditions presented in the computer, which are shown herein, a scanning area is divided into three areas as shown in FIG. 9, and in areas 901 and 903, acceleration voltage of the irradiated electron-beam is set to 500 V and a current value is set to 4 pA, and in an area 902, the former is set to 800 V and the latter is set to 8 pA. Further, the signal cumulated number is 8 times in both areas.

Further, a focus of the irradiated electron-beam is optimized in the area 901 and in the area 902, a position which is 80 nm lower than the position is set as the focus. The area 903 has the same setting values as the time of scanning the area 901.

Next, the process proceeds to step 806 and the conditions are accepted and 'Execute' is clicked among process selecting buttons represented by reference numeral 1907 and the image is obtained.

Next, the process proceeds to step 807 and in the arithmetic device 1803, an edge of a line pattern is extracted from the acquired image data and the linewidth profile is acquired.

In the embodiment, the signal cumulated number is 8 times in all the areas, but when charge-up is particularly intensified, the scanning number of times may be reduced to 6 times in the regions 901 and 903. As described above, when the condition values intend to be changed to values presented in the computer, a mouse as a part of the input device 1802 is used, a predetermined cell of a scanning condition displaying unit 1906 of each scanning area is clicked, and the values may be inputted from a keyboard as a part of the input device 1802. Further, the arithmetic device 1803 has individual functions to execute steps 802, 804, 805, and 807.

As a result, an error of the linewidth profile is 5 nm in the related art, but the error may be reduced up to 2 nm. Therefore, precision in pattern inspection is improved and a yield rate is improved.

According to the embodiment, there may be provided a semiconductor inspection device and a method for inspecting the semiconductor inspection device that can suppress variations in an edge position measurement error caused by a material structure of a lower layer of a measurement pattern by dividing the scanning areas based on the structure or material of the observation target and changing the scanning condition in each scanning area in the specimen image within one viewing field acquired by using the electron microscope.

Second Embodiment

In the embodiment, an example of measuring a linewidth profile of a line pattern of Si prepared on the structure of an insulator and a semiconductor, which has a step by using a second method as an example of a mode for carrying out the present invention will be described with reference to FIGS. 5, 6, 10, 11, 12, 20, and 21.

Figure 10:
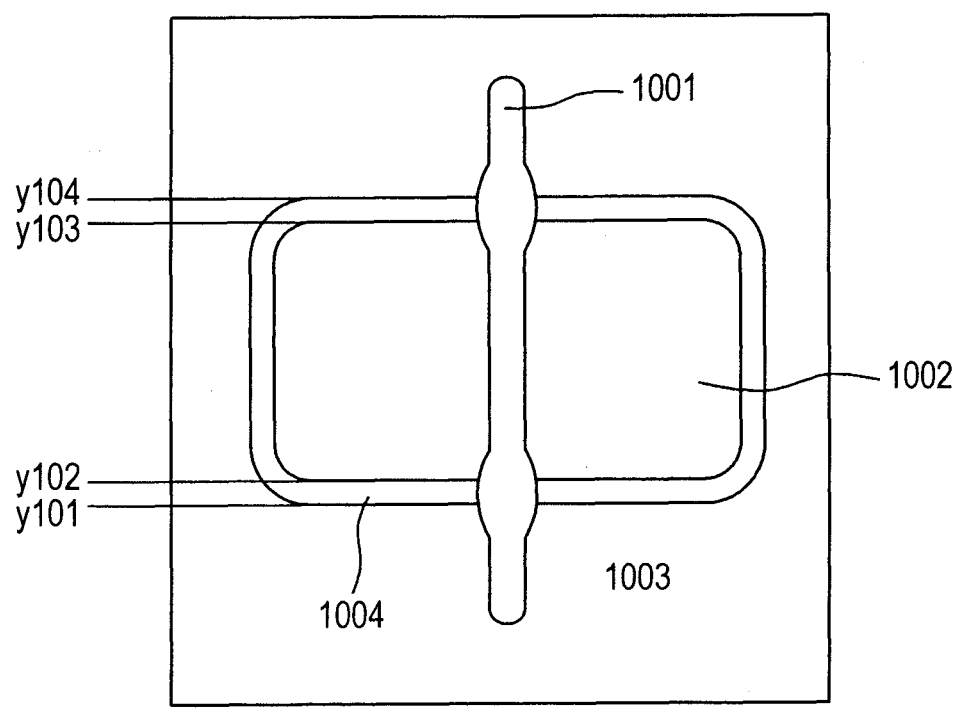
FIG. 10 is a diagram showing a 2D contour profile of an estimated pattern used for analysis in the second embodiment.
Figure 11:
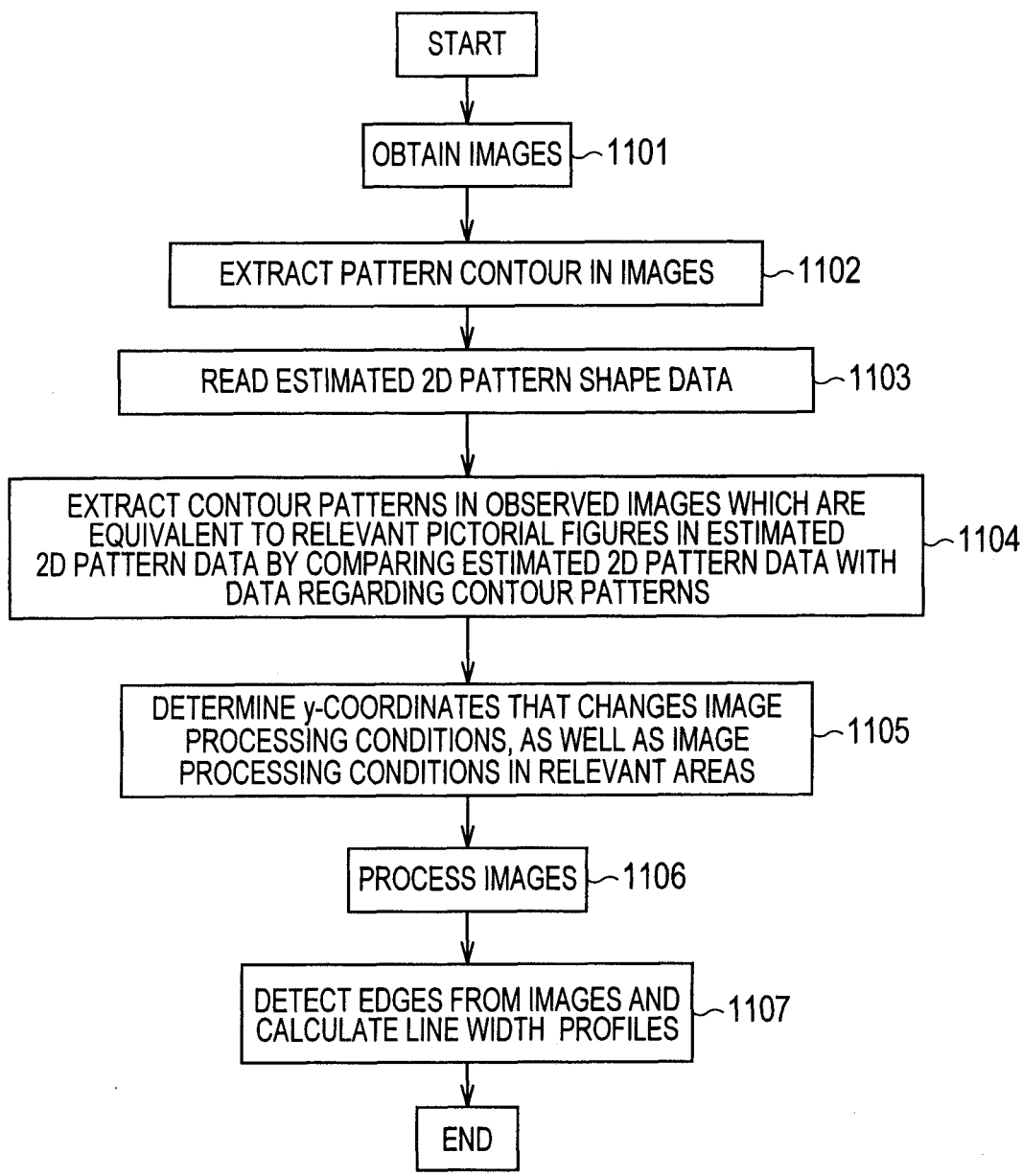
FIG. 11 is a flowchart recording a flow of the second embodiment.
Figure 12:
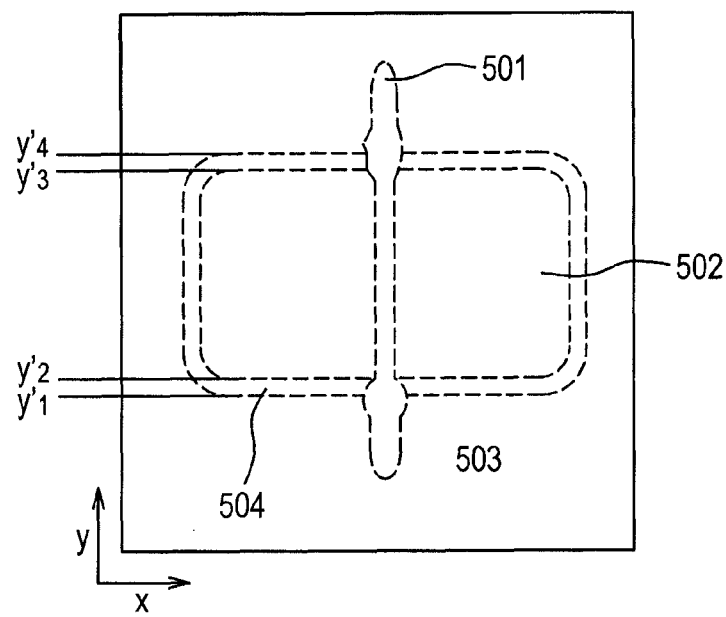
FIG. 12 is a diagram showing an area that should be subjected to another image processing on an observed image in the second embodiment.
Figure 20:
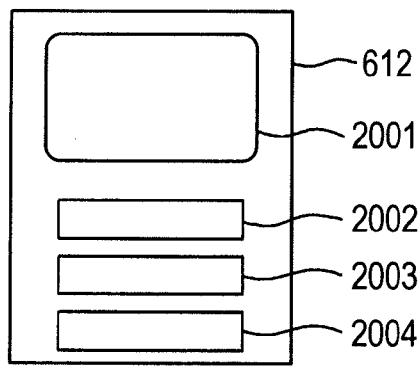
FIG. 20 is a conceptual diagram showing a configuration of a computer 612 used in the second and third embodiments.
Figure 21:
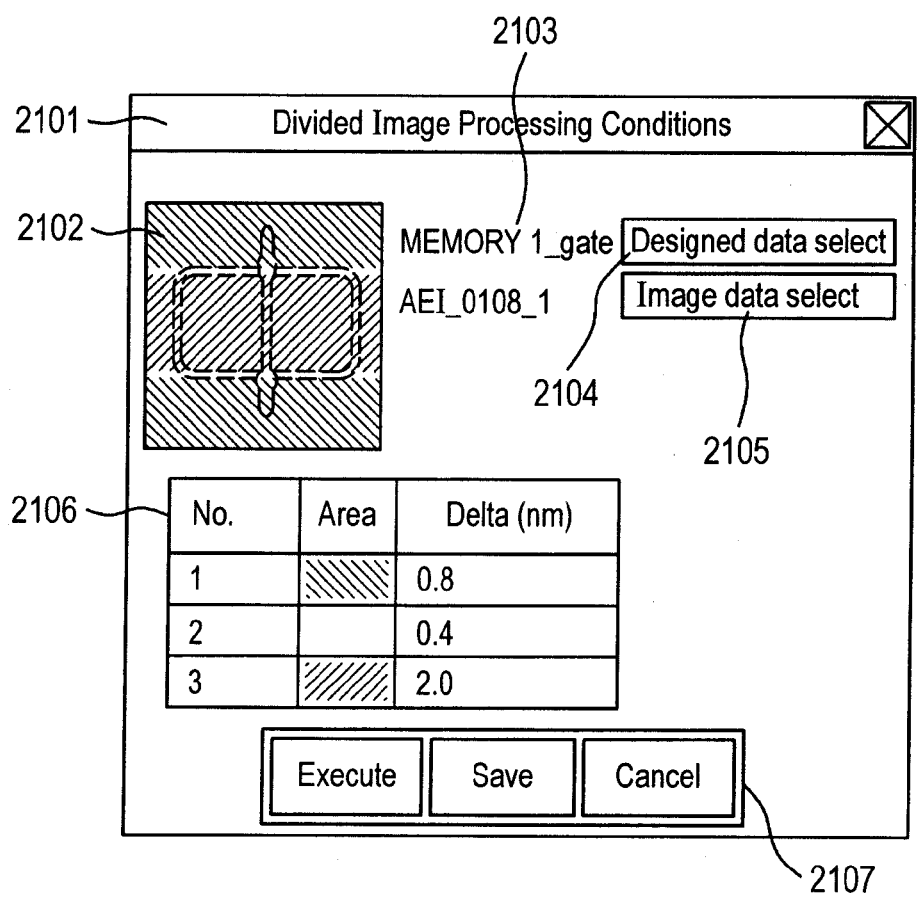
FIG. 21 is a screen displayed on a monitor of the second embodiment.

FIG. 5 is a mimetic diagram of an image of an electron microscope of which a linewidth profile is calculated in the embodiment. FIG. 6 is a conceptual diagram of a device used in the embodiment. FIG. 10 shows a 2D contour profile of an estimated pattern used for analysis in the embodiment. FIG. 11 is a flowchart recording a flow of the embodiment. FIG. 12 is a diagram showing a boundary for executing image processing under another condition. FIG. 20 shows a configuration of the embodiment of the system controlling computer 612 in FIG. 6. Further, FIG. 21 shows an example of a window 2101 displayed on a monitor 2001. Reference numeral 2102 represents a 2D image in which an SEM image and an area subjected to another image processing are overlapped with each other, reference numeral 2103 represents a display unit of names of a design data file and an SEM image file, reference numeral 2104 represents a click button when design data intends to be changed, reference numeral 2105 represents a click button when the SEM image intends to be changed, and reference numeral 2106 represents a processing condition display unit of each image processing area.

First, a signal is sent to the control device 611 of the scanning type electron microscope by using the system controlling computer 612 and the wafer 607 is installed on the observation stage and thereafter, the image of the pattern is obtained (step 1101). Herein, the acceleration voltage of the irradiated electron-beam 603 is 500 V and the current value is 4 pA. Further, the signal cumulated number is 16 times. Further, both the length and the breadth of the observation area are 900 nm. As a result, the image shown in FIG. 5 may be acquired. The image is constituted by total 512 pixels in both length and breadth. Further, the focus of the irradiated electron-beam is optimized as the pattern on the area 503.

Continuously, operations described below are performed by operating the system controlling computer 612 through an input device 2002. First, the process proceeds to step 1102 to extract the edge of the line pattern from the obtained image data by using an arithmetic device 2003.

Further, the process proceeds to step 1103 to transmit to a temporary storage device 2004 a 2D pattern profile estimated based on a mask profile and a lithography condition which was stored in the storage device 613 by the arithmetic device 2003 (reading). Further, the design data may be used.

Continuously, the process proceeds to step 1104 and the arithmetic device 2003 compares the pattern contour in the image extracted in step 1102 and the pattern profile acquired in step 1103 and makes each pattern defined in the latter correspond to the contour pattern in the observed image. The arithmetic device 2003 discovered that the gate pattern 501 in the observed image corresponds to reference numeral 1001, the active region pattern 502 corresponds to reference numeral 1002, the insulating film region pattern 503 corresponds to reference numeral 1003, and a step area pattern 504 corresponds to reference numeral 1004 (extraction).

Next, the process proceeds to step 1105 and the arithmetic device 2003 divides the image. First, as shown in FIG. 10 showing the estimated profile of the pattern, y-coordinates equivalent to y-coordinates, i.e., y101, y102, y103, and y104 (represent values of the estimated profile in FIG. 10) of pixels of a part where the background is changed along the gate pattern 1001 in a y direction are discovered in FIG. 5 which is the actual observed image diagram. Values of the corresponding y-coordinates are set to y'1, y'2, y'3, and y'4. The values are values on the image.

Therefore, the image shown in FIG. 5 is divided into 5 areas by a straight line. Five areas include an area 1 from y=0 to y=y'1, an area 2 from y=y'1 to y=y'2, an area 3 from y=y'2 to y=y'3, an area 4 from y=y'3 to y=y'4, and an area 5 from y=y'4 to y=511. This shape is shown in FIG. 12.

In FIG. 12, a boundary of the area from the area 1 to the area 5 is expressed by a solid line in FIG. 5. Further, a dotted line is a contour of a pattern that exists in the area. The gate pattern 501 to the step area pattern 504 are the same as those shown in FIG. 5.

In the process up to step 1104, it can be seen that the gate pattern 501 is made of poly-Si, the active area pattern 502 is doped Si, the insulating film area pattern 503 is made of $SiO_2$, the surface of the insulating film area pattern 503 is 80 nm higher than the active area pattern 502, and the step area pattern 504 is made of $SiO_2$ and a boundary between the active area pattern 502 and the insulating film area pattern 503.

Based on the information, the arithmetic device 2003 determines image processing executed with respect to the area from the area 1 to the area 5 as described below. However, a function described below is stored in the storage device 613 in advance.

An ideal secondary electron signal strength acquired by crossing a pattern on a conductor or a semiconductor after optimizing the focus of the electron microscope, i.e., a signal profile is given by Equation 1.

[Equation 1]

$$I=S(x) \quad (1)$$

Further, when the signal profile is blurred due to charge-up or focus displacement, the signal profile is expressed by the following equation.

[Equation 2]

$$I=\int g(\Delta;x'-x)S(x')dx' \quad (2)$$

Herein, a function g is given by Equation 3.

[Equation 3]

$$g(\Delta;z)=\exp(-z^2/\Delta^2) \quad (3)$$

When the signal profile emitted from the pattern on the $SiO_2$ film, i.e., the signal profiles of the area 1 and the area 5 are blurred due to charge-up, $\Delta$=2 mm. Meanwhile, since the signal profile on the doped Si, i.e., the area 3 has different permittivity from the $SiO_2$ film, the signal profile is not blurred due to charge-up, but the focus is displaced by 80 nm, and as a result, the signal profile is also blurred. This phenomenon may be described by setting $\Delta$=0.8 nm in Equations 2 and 3.

In the areas 2 and 4, although the heights are changed in the areas 2 and 4, it is regarded that the focus is displaced by a half of 80 nm, i.e., 40 nm and a blurring effect is introduced in Equation 4 with respect to the signal profiles of the areas 2 and 4.

[Equation 4]

$$I=\int dx'' g(\Delta_2;x''-x)[\int g(\Delta_1;x'-x)S(x')dx'] \quad (4)$$

Herein, $\Delta_1$=2 nm and $\Delta_2$=0.4 nm.

As described above, the blurring degree of the signal on the observed image varies depending on a place. Therefore, an operation for being equipped with the blurring effect is required. The signal profile acquired from the image is represented by S'(x). Since the signal profiles of the areas 1 and 5 are already being blurred due to charge-up, a further effect in which the focus is displaced by 80 nm is just inputted. That is, it is expressed in the following Equation 5.

[Equation 5]

$$I=\int g(\Delta_{1\&5};x'-x)S'(x')dx' \quad (5)$$

Herein, $\Delta_{1\&5}$=0.8 nm.

The effect of the focus displacement of 40 nm is added to the signal profiles of the areas 2 and 4. That is, it is expressed in the following Equation 6.

[Equation 6]

$$I=\int g(\Delta_{2\&4};x'-x)S'(x')dx' \quad (6)$$

Herein, $\Delta_{2\&4}$=0.4 nm.

The influence of charge-up is added to the signal profile of the area 3. That is, it is expressed in the following Equation 7.

[Equation 7]

$$I=\int g(\Delta_3;x'-x)S'(x')dx' \quad (7)$$

Herein, $\Delta_3$=2 nm.

Next, the process proceeds to step 1106 and execution of processing is selected on a screen shown in FIG. 21. Herein, an image processing condition 1 on the screen represents a condition of image processing executed in the areas 1 and 5, an image processing condition 2 represents a condition of image processing executed in the areas 2 and 4, and an image processing condition 3 represents a condition of image processing executed in the area 3. Further, a parameter value of the function may be set by clicking on a cell. For example, in a row No. 1 equivalent to the areas 1 and 5, 80 nm should be inputted as a value of $\Delta$.

After inputs thereof are terminated, processing may be executed by clicking on Execute at a left end of a click button 2107. Thereafter, as determined above, the blurring processing is executed with respect to the signals from the area 1 to the area 5 by the arithmetic device 2003.

Further, the process proceeds to step 1107 and the edge of the pattern corresponding to the pattern 501 may be calculated (extracted) and the linewidth profile may be acquired (also executed by the arithmetic device 2003) on the signal strength distribution acquired in step 1106 by using a method applied to a general electron microscope image. Further, the arithmetic device 2003 has individual functions to execute steps 1102, 1103, 1104, 1105, 1106, and 1107.

As a result, the error of the linewidth profile is 5 nm in the related art, but the error may be reduced up to 2 nm. Therefore, the precision in pattern inspection is improved and the yield rate is improved.

According to the embodiment, there may be provided a semiconductor inspection device and an inspection method of the semiconductor inspection device that can suppress variations in an edge position measurement error caused by the material structure of the lower layer of the measurement pattern by dividing the processing area into the plural areas based on the information on the structure or material of the observation target within the specimen image in one viewing field acquired by using the electron microscope and executing optimal image processing suitable for each area to acquire the same image as the image acquired in the first embodiment.

Third Embodiment

In the embodiment, an example of measuring the linewidth profile of a line pattern of Si prepared on the structure of an insulator and a semiconductor, which has a step by using a third method as an example of a mode for carrying out the present invention and will be described with reference to FIGS. 6, 13, 14, 15, 16, 17, 20, and 22.

Figure 13:
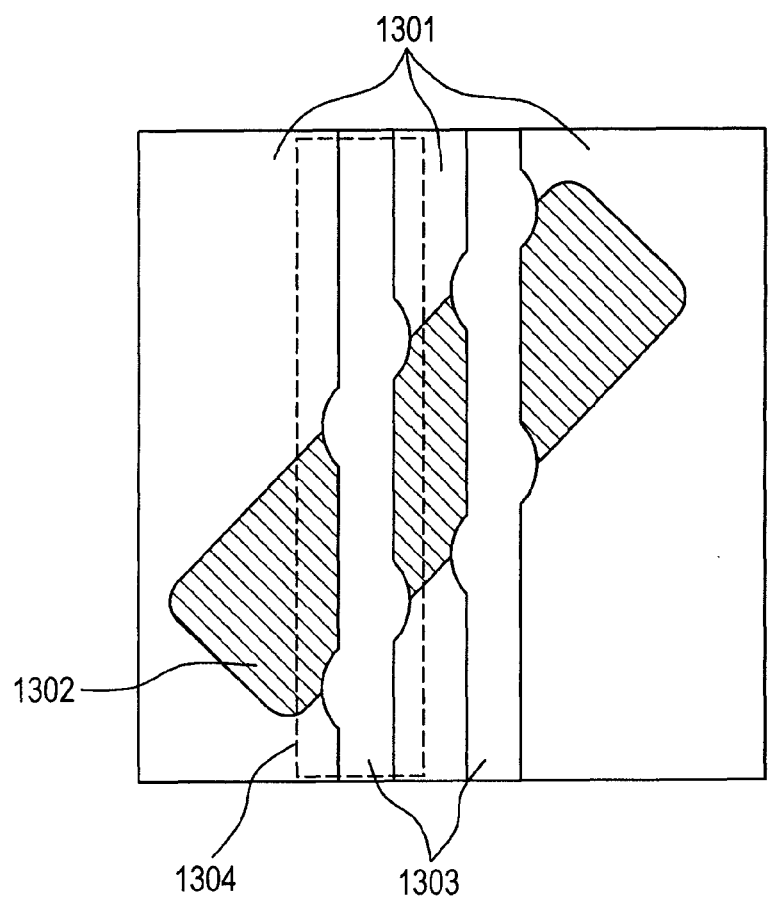
FIG. 13 is a mimetic diagram showing an electro microscope image of which a linewidth profile is calculated and an inspection area (dotted line) placed thereon in the third embodiment.
Figure 14:
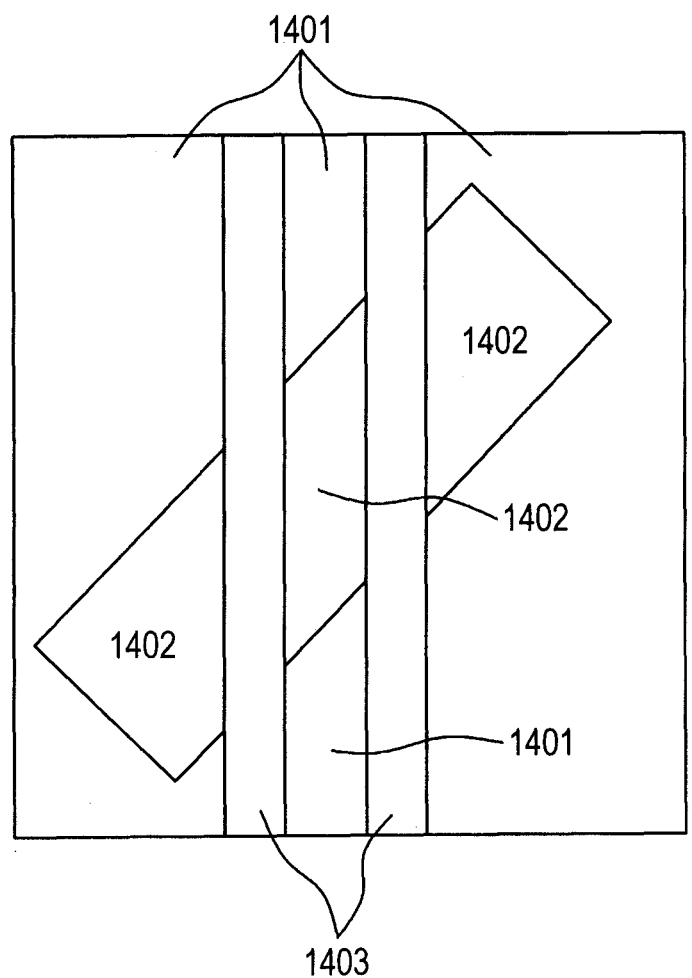
FIG. 14 is a plan view of a designed pattern used for analysis in the third embodiment.
Figure 15:
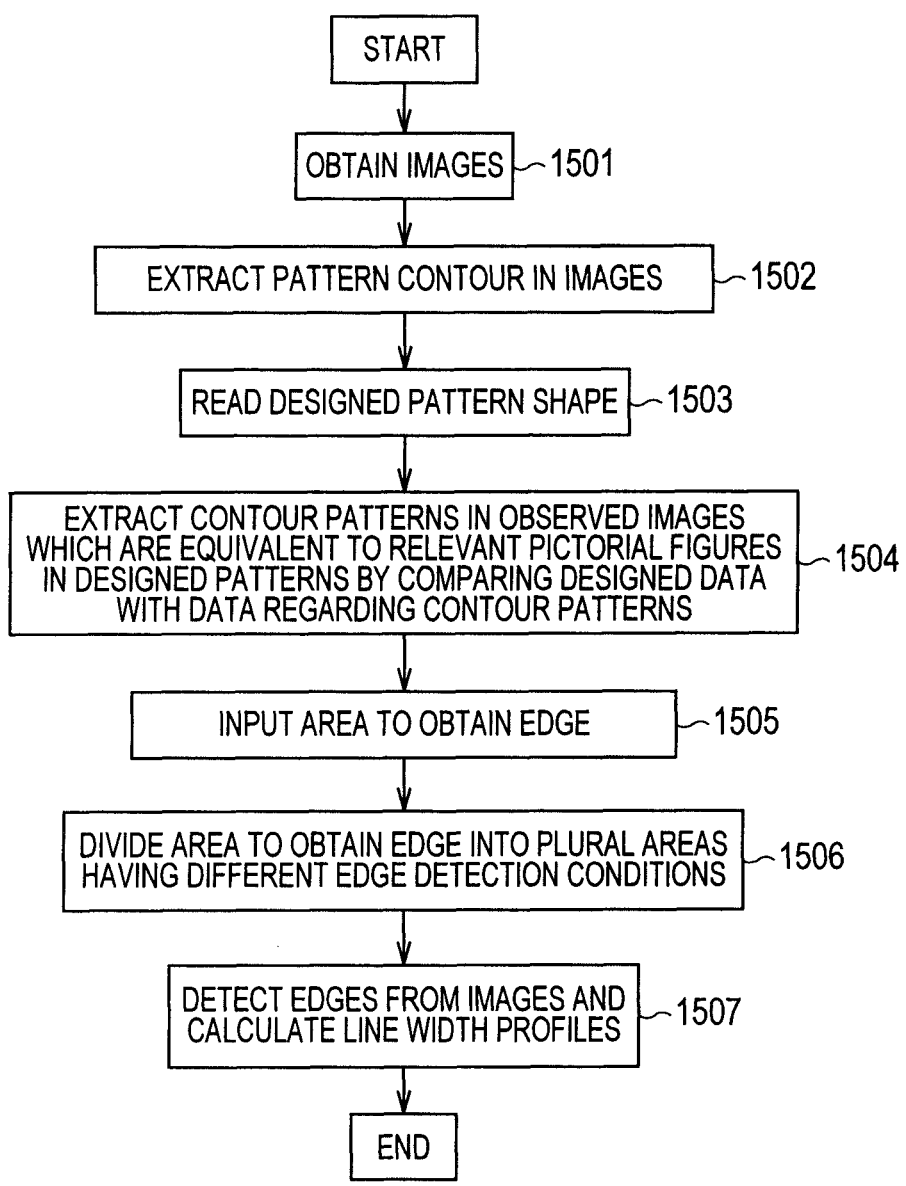
FIG. 15 is a flowchart recording a flow of the third embodiment.
Figure 16:
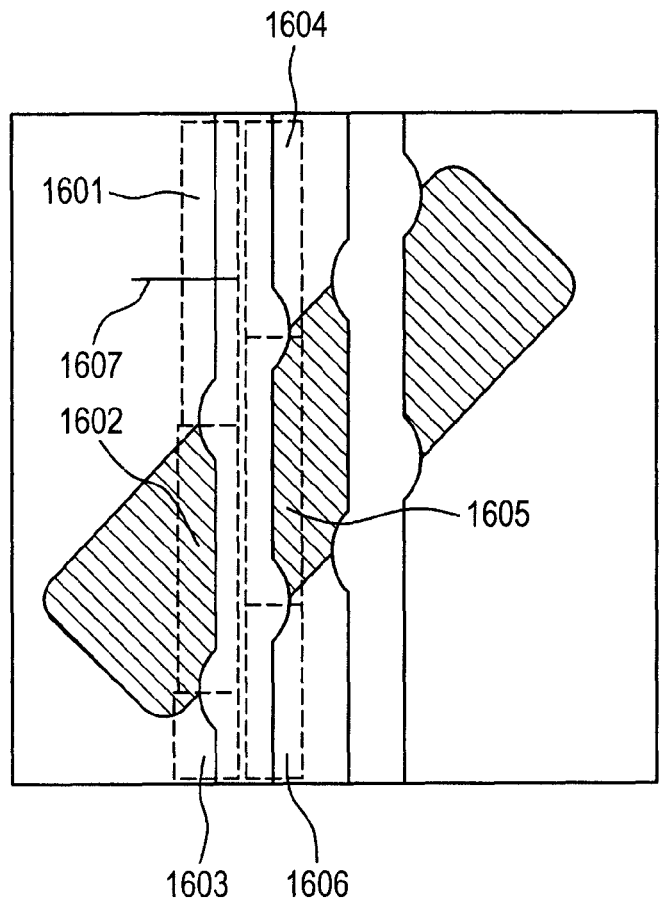
FIG. 16 is a mimetic diagram showing the electro microscope image of which the linewidth profile is calculated and the inspection area (dotted line) after dividing, which is placed thereon in the third embodiment.
Figure 17:
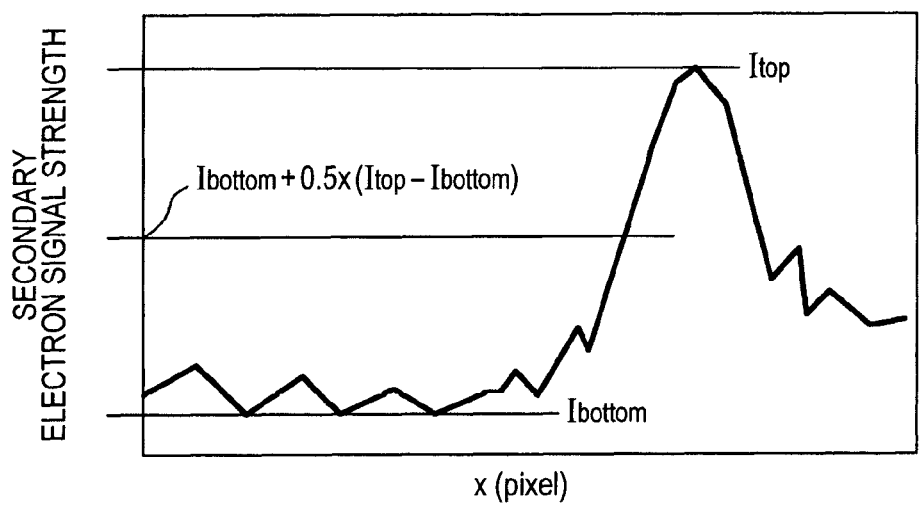
FIG. 17 is a mimetic diagram of a signal profile describing the definition of an edge used in the third embodiment.

FIG. 6 is a conceptual diagram of a device used in the embodiment. FIG. 13 is a mimetic diagram showing the electron microscope image of which the linewidth profile is calculated and an inspection area 1304 (dotted line) of the edge placed thereon in the embodiment. FIG. 14 shows data of a designed pattern profile used for analysis in the embodiment. Reference numeral 1401 represents the isolating insulating film area. FIG. 15 is a flowchart recording a flow of the embodiment. FIG. 16 is a mimetic diagram showing the electron microscope image of which the linewidth profile is calculated and an inspection area (dotted line) after dividing, which is placed thereon in the embodiment. FIG. 17 is a diagram describing a definition of the edge used in the embodiment. Further, the configuration of the computer 612 used in the embodiment is the same as the configuration of the second embodiment as shown in FIG. 20.

First, step 1501 shown in FIG. 15 is executed. That is, the system controlling computer 612 is operated, the signal is sent to the control device 611 of the scanning type electron microscope, and the wafer 607 is installed on the observation stage and thereafter, the image of the pattern is obtained. Herein, the acceleration voltage of the irradiated electron-beam 603 is 500 V and the current value is 4 pA. Further, the signal cumulated number is 16 times. Further, the size of the observation area is 450 nm in both length and breadth.

As a result, the image shown in FIG. 13 may be acquired (however, the dotted line is excluded). The image is constituted by 512 pixels in both length and breadth. Further, the focus of the irradiated electron-beam is optimized under a condition to pick up an edge of a gate pattern 1303 on an active area 1302 most clearly. Reference numeral 1301 represents the isolating insulating film area.

Next, operations described below are performed. All the operations are performed by using operating the system controlling computer 612 through the input device 2002. First, the process proceeds to step 1502 and the arithmetic device 2003 extracts the contour of the pattern from the obtained image data. Further, the arithmetic device 2003 has individual functions to execute steps 1502, 1503, 1504, 1506, and 1507.

Further, the process proceeds to step 1503 to transmit to the temporary storage device 2004 the designed pattern profile (FIG. 14) which was stored in the storage device 613 by using the arithmetic device 2003 (reading). Further, although the design data is used in the embodiment, data of the pattern profile estimated through the whole patterning process in the actual semiconductor device manufacturing process may be used.

Continuously, the process proceeds to step 1504 and the arithmetic device 2003 compares the pattern contour within the image extracted in step 1502 and the pattern profile acquired in step 1503 and makes each pattern defined in the latter correspond to the contour pattern in the observed image. It is discovered that a pattern 1402 in the observed image is equivalent to the active area 1302 and a pattern 1403 is equivalent to the gate pattern 1303 (extraction).

Next, the process proceeds to step 1505 to input an area of which the linewidth profile intends to be calculated, i.e., an edge inspection area 1304. This operation is performed by displaying the area of which the linewidth profile is found, on the image displayed on the monitor 2001 by using the mouse as a part of the input device 2002. A periphery drawn by the dotted line of FIG. 13 is the area designated herein.

At that time, the arithmetic device 2003 of the computer 612 divides the inspection area according to the data shown in FIG. 14 (step 1506). First, positions of a right edge and a left edge of the line pattern in the inspection area 1304 are determined and the inspection area is divided into two areas corresponding to vicinities of the edges.

Next, each area is divided into a part where the edge is placed on the insulator and a part where the edge is placed on the semiconductor by using data regarding the material or structure which is stored in advance. As a result, the area where the edge is detected is divided into a total of 6 areas which are areas 1601 to 1606 as shown in FIG. 16.

Next, the process proceeds to step 1507 to extract the edge of the pattern and calculate the linewidth profile by using the arithmetic device 2003. Further, the pattern edge is extracted according to the following sequence.

First, x-dependence of a secondary electron strength fixing a y-coordinate (y=0 to y=511) in the image, i.e., a signal profile is recorded as Equation 8.

[Equation 8]

$$I = S(y; x) \quad (8)$$

When noise is large, plural signal profiles are averaged before detecting the edge. Even in the embodiment, the averaging is performed. As a result, the signal profile is given by Equation 9.

[Equation 9]

$$I' = S'(y; x) = \frac{1}{2i+1} \sum_{y'=y-i}^{y'=y+i} S(y'; x) \quad (9)$$

Thereafter, a portion on each signal profile where the signal strength is a half of the maximum value is determined as the edge.

Figure 22:
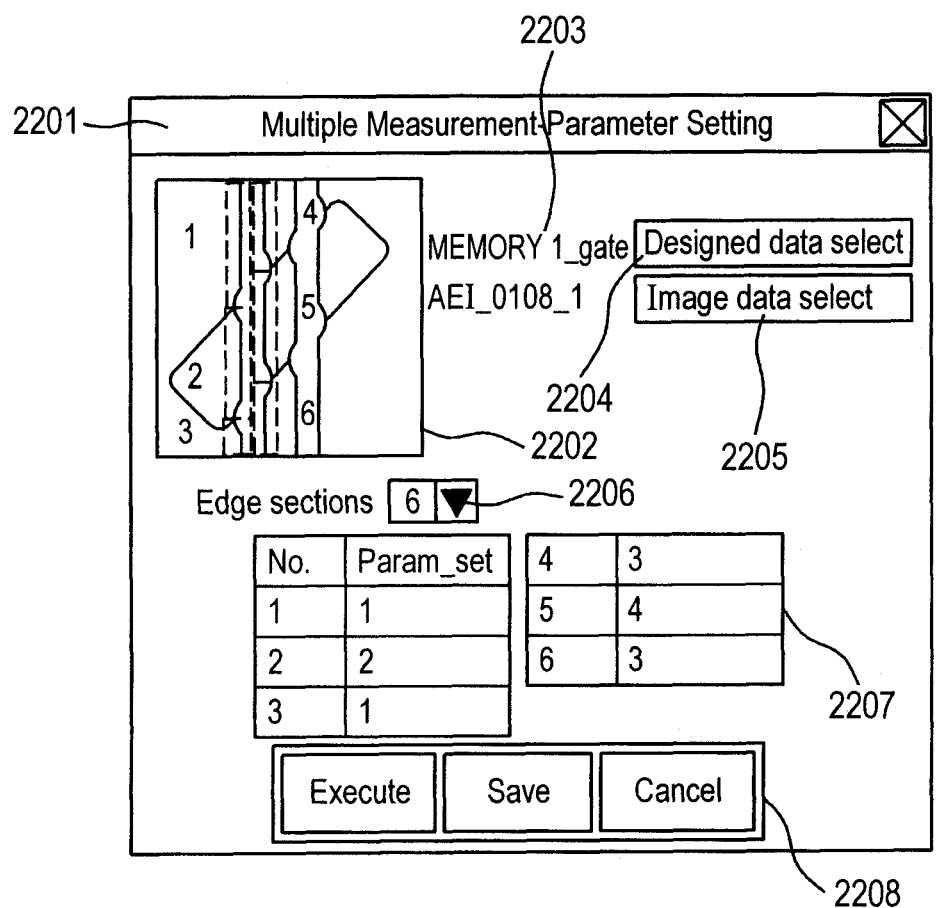
FIG. 22 is a screen displayed on a monitor of the third embodiment.

The signal profile plotted along a straight line 1607 crossing the pattern in FIG. 16 and a profile in which the edge is determined thereon are shown in FIG. 17. Further, the image of FIG. 16 and the shape of a window 2201 on which the set-up of each edge detection parameter is displayed are shown in FIG. 22. Reference numeral 2202 represents a 2D image in which an SEM image and an area subjected to another edge detection are overlapped with each other, reference numeral 2203 represents a display unit of names of a design data file and an SEM image file, reference numeral 2204 represents a click button when design data intends to be changed, reference numeral 2205 represents a click button when the SEM image intends to be changed, and reference numeral 2206 represents a selection button of the number of required inspection areas, reference numeral 2207 represents an edge detection (extraction) condition display unit of each edge detection (extraction) area, and reference numeral 2208 represents a click button.

At the time of performing this operation, since the background is the insulator in the areas 1601, 1603, 1604, and 1606, i is set to 4 by taking into consideration that noise is large. That is, the number of averaged signal profiles is set to 9. Meanwhile, since the background is the semiconductor in the areas 1602 and 1605, i is set to 1 by taking into consideration that noise is small. That is, the number of averaged signal profiles is set to 3.

Herein, as shown in the number selecting button 2206 of FIG. 22, the areas 1601 and 1603 become the areas 1 and 3 herein and the parameter set (a parameter set for extracting the edge using i=4 corresponding to the left edge of the line) is defined as a set of No. 1. Further, the area 1602 is the left edge of the line in which i=1, but is a set of No. 2, the areas 1604 and 1606 are the areas 4 and 6 and the number of the parameter set is 3. The area 1605 is the area 5 and the number of the parameter set is 4. In each case, when the number of 'Param_set' is clicked, a parameter set corresponding to the number may be displayed and edited.

Based on the profile after averaging thereof, an accurate average position (Ibottom+0.5×(Itop−Ibottom)) of the smallest signal strength Ibottom and the largest signal strength Itop outside the pattern is defined as an edge point as shown in FIG. 17.

As described above, when the method of dividing the inspection area is not selected, i should be set to 3 on the whole. However, up to a high-frequency component of the profile of the pattern edge needs to be measured on a part which is placed on the semiconductor, i.e., the areas 1602 and 1605 with precision.

Up to now, since i is set to 3 on the whole, a cycle equivalent to a limit of the high-frequency component side of the edge profile is double a length equivalent to 9 pixels, i.e., 15.8 nm. However, by using the method, the cycle becomes double the length equivalent to 3 pixels, i.e., 5.3 nm in regards to a profile of an important part. A gate width of a transistor is approximate to 50 nm, but there is a need for detecting up to a component of a short cycle of approximately 1/10 of the gate width at the time of examining a gate line-shaped concave-convex. A component of a sufficiently short cycle can be detected by using the method.

As a result, a linewidth profile in which an edge of an important pattern is detected with high precision can be acquired. Therefore, the precision in pattern inspection is improved and the yield rate is improved.

According to the embodiment, there may be provided a semiconductor inspection device and an inspection method of the semiconductor inspection device that can suppress variations in an edge position measurement error caused by a material structure of a lower layer of a measurement pattern by dividing the edge inspection area into the plural areas based on the information on the structure or material of the observation target and acquiring the edge by using the optimal edge detection condition for each area at the time of detecting the edge of the pattern from the image in the edge inspection area within the specimen image in one viewing field acquired by using the electron microscope.

REFERENCE SIGNS LIST

101 . . . Gate of transistor
102 . . . Active area of transistor
103 . . . Insulating film area isolating transistors from each other
104 . . . Step area in which insulating film isolating transistors from each other is cut
201 . . . Active area in linewidth profile of gate pattern
202 . . . All important areas in linewidth profile of gate pattern
301 . . . Mimetic diagram of electron microscope photograph from upper part of line pattern
302 . . . First line among straight lines crossing vertically with respect to line extension direction in 301
303 . . . Second line among straight lines crossing vertically with respect to line extension direction in 301
304 . . . Cross-sectional view when pattern is cut in plane vertical to 301 including straight line 302
305 . . . Cross-sectional view when pattern is cut in plane vertical to 301 including straight line 303
306 . . . Signal profile on straight line 302
307 . . . Signal profile on straight line 303
401 . . . Line pattern in electron microscope photograph
402 . . . Line pattern in electron microscope photograph
403 . . . Straight line crossing vertically with respect to line extension direction in electron microscope photograph
404 . . . Signal profile on straight line 403
501 . . . Gate of transistor
502 . . . Active area of transistor
503 . . . Insulating film area isolating transistors from each other
504 . . . Step area in which insulating film isolating transistors from each other is cut
601 . . . Casing of scanning type electron-beam microscope
602 . . . Electron gun
603 . . . Electron-beam
604 . . . Convergence lens
605 . . . Beam deflector
606 . . . Objective lens
607 . . . Observation wafer
608 . . . Stage
609 . . . Secondary electron
610 . . . Detector
611 . . . Control device of scanning type electron microscope
612 . . . Computer for operator to control scanning type electron microscope and system that analyzes observation result
613 . . . Data storage device
701 . . . Gate pattern on design data
702 . . . Active area of design data
703 . . . Transistor isolation area on design data
801 . . . Process of acquiring first image
802 . . . Process of extracting contour of pattern in observed image
803 . . . Process of reading design data from storage device
804 . . . Process of recognizing figures that correspond to each other by comparing contour extracted from observed image with design data
805 . . . Process of dividing observation area into plurality of areas having different scanning conditions according to result of 804

806 ... Process of acquiring image again according to result of 805
807 ... Process of detecting edge of pattern from observed image acquired in 806 and acquiring linewidth profile
901 ... Area to which electron-beam of acceleration voltage of 500 V and current value of 4 pA is irradiated
902 ... Area to which electron-beam of acceleration voltage of 800V and current value of 8 pA is irradiated
903 ... Area to which electron-beam of acceleration voltage of 500 V and current value of 4 pA is irradiated
1001 ... Gate of transistor
1002 ... Active area of transistor
1003 ... Insulating film area isolating transistors from each other
1004 ... Step area in which insulating film isolating transistors from each other is cut
1101 ... Process of acquiring image
1102 ... Process of extracting contour of pattern in observed image
1103 ... Process of reading estimated 2D pattern profile data from storage device
1104 ... Process of recognizing figures that correspond to each other by comparing 2D pattern profile data estimated by contour extracted from observed image
1105 ... Process of dividing observation area into plurality of areas and determining image processing condition executed with respect each area according to result of 1104
1106 ... Process of executing image processing according to result of 1105
1107 ... Process of detecting edge of pattern from image subjected to image processing in 1106 and acquiring linewidth profile
1301 ... Insulating film area isolating active areas from each other
1302 ... Active area
1303 ... Gate pattern
1304 ... Inspection area of edge
1401 ... Insulating film area isolating active areas on design data from each other
1402 ... Active area on design data
1403 ... Gate pattern on design data
1501 ... Process of acquiring image
1502 ... Process of extracting contour of pattern in observed image
1503 ... Process of reading design data from storage device
1504 ... Process of recognizing figures that correspond to each other by comparing contour extracted from observed image with design data
1505 ... Process for operator to input area of which edge is acquired
1506 ... Process of dividing area inputted in 1505 according to result of 1504 and determining detection (extraction) condition of edge in each of further divided areas
1507 ... Process of detecting edge of pattern from observed image according to condition determined in 1506 and acquiring linewidth profile
1601 ... First edge inspection area acquired by dividing
1602 ... Second edge inspection area acquired by dividing
1603 ... Third edge inspection area acquired by dividing
1604 ... Fourth edge inspection area acquired by dividing
1605 ... Fifth edge inspection area acquired by dividing
1606 ... Sixth edge inspection area acquired by dividing
1607 ... Straight line crossing vertically with respect to line extension direction in electron microscope photograph
1801 ... Monitor
1802 ... Input device
1803 ... Arithmetic device performing image processing and scanning condition selection
1804 ... Storage device storing data temporarily
1901 ... Window displayed on monitor in first embodiment
1902 ... 2D image in which SEM image and divided scanning areas are overlapped with each other
1903 ... Display unit of names of design data file and SEM image file
1904 ... Click button when design data intends to be changed
1905 ... Click button when SEM image intends to be changed
1906 ... Scanning condition display unit of each scanning area
1907 ... Click button of operation which can be performed next
2001 ... Monitor
2002 ... Input device
2003 ... Arithmetic device performing image processing condition selection and image processing
2004 ... Storage device storing data temporarily
2101 ... Window displayed on monitor in second embodiment
2102 ... 2D image in which SEM image and area subjected to another image processing are overlapped with each other
2103 ... Display unit of names of design data file and SEM image file
2104 ... Click button when design data intends to be changed
2105 ... Click button when SEM image intends to be changed
2106 ... Processing condition display unit of each image processing area
2107 ... Click button of operation which can be performed next
2201 ... Window displayed on monitor in third embodiment
2202 ... 2D image in which SEM image and area subjected to another edge detection are overlapped with each other
2203 ... Display unit of names of design data file and SEM image file
2204 ... Click button when design data intends to be changed
2205 ... Click button when SEM image intends to be changed
2206 ... Selection button of number of required edge inspection areas
2207 ... Edge detection (extraction) condition display unit of each edge inspection area
2208 ... Click button of operation which can be performed next

The invention claimed is:
1. A semiconductor inspection device evaluating a 2D profile by detecting an edge of a pattern from an image acquired by observing the pattern on a substrate by scanning an electron-beam, comprising:
a storage device previously storing design data of the pattern or data of a pattern profile estimated through the whole patterning process, and data of the pattern and a material configuring a background of the pattern or a structure of a background of the pattern; and
an arithmetic device having a comparison function of comparing the design data of the pattern or the data of the pattern profile estimated through the whole patterning process which is stored in advance with the data of the image acquired through observation, a dividing function of dividing the image into a plurality of areas for each expected area, in one viewing field, when reaction to the electron-beam incident in the observation area is different by using a result of operating the comparison function and the data of the material configuring the background of the pattern or the structure which is stored in advance, and a function of calculating a linewidth profile by detecting the edge of the pattern from an image acquired by using image-processing in the plural areas under different image processing conditions;

wherein the data of the material data includes data regarding permittivity, and the image processing includes processing that blurs the image in accordance with the permittivity data that influences charge-up.

2. The semiconductor inspection device according to claim 1, wherein the data of the structure data includes data of a height of a surface of the observation area with the pattern from a reference surface, and the image processing is based on the height data and includes processing that blurs the image in accordance with displacement of a focus.

3. A semiconductor inspection method using the semiconductor inspection device according to claim 1, comprising:

a process of acquiring a first image of a pattern;

a process of extracting a contour of the acquired first image pattern;

a process of extracting patterns that correspond to each other by comparing the extracted pattern of the contour and design data of the pattern or data of a pattern profile estimated through the whole patterning process;

a process of dividing an area including the patterns that correspond to each other into a plurality of areas by using the pattern and data of the material configuring the background of the pattern or the structure;

a process of determining an image processing condition in the area including the patterns that correspond to each other for each of the plurality of areas;

a process of acquiring a second image by image-processing in accordance with the image processing condition determined for each of the plurality of areas; and a process of detecting a desired edge from the second image and calculating a linewidth profile.

* * * * *